United States Patent
van den Berg

(10) Patent No.: US 6,396,694 B1
(45) Date of Patent: May 28, 2002

(54) CLOSED BOX FOR ELECTRONIC EQUIPMENT

(75) Inventor: Karl van den Berg, Bleskensgraaf (NL)

(73) Assignee: Lely Research Holding A.G., Zug (CH)

( * ) Notice: Subject to any disclaimer, the term of this patent is extended or adjusted under 35 U.S.C. 154(b) by 0 days.

(21) Appl. No.: 09/684,732

(22) Filed: Oct. 6, 2000

Related U.S. Application Data

(63) Continuation of application No. PCT/NL00/00082, filed on Feb. 10, 2000.

(30) Foreign Application Priority Data

Feb. 10, 1999 (NL) .............................................. 1011261
Sep. 14, 2000 (WO) ........................................... 00/54382

(51) Int. Cl.[7] .............................................. H05K 1/20
(52) U.S. Cl. ...................... 361/704; 361/702; 361/710; 257/787; 439/74; 439/75
(58) Field of Search ............................... 361/702–707, 361/710–713, 714–717, 748–751; 174/52.2, 52.4, 52.3, 655.5, 52.1, 68.5; 257/709, 710, 729, 787, 788, 791; 29/849, 846, 825, 832; 439/74, 75, 76.1; 285/925

(56) References Cited

U.S. PATENT DOCUMENTS

| | | | | |
|---|---|---|---|---|
| 4,710,419 A | * | 12/1987 | Gregory | 428/210 |
| 4,811,482 A | * | 3/1989 | Moll | 29/848 |
| 4,911,519 A | * | 3/1990 | Burton et al. | 350/96.2 |
| 4,958,260 A | * | 9/1990 | Kobayashi et al. | 361/749 |
| 5,253,143 A | * | 10/1993 | Klinger et al. | 361/736 |
| 5,689,089 A | * | 11/1997 | Polak et al. | 174/52.4 |
| 5,708,743 A | * | 1/1998 | DeAndrea et al. | 385/88 |

FOREIGN PATENT DOCUMENTS

| | | |
|---|---|---|
| DE | 2 013 738 | 10/1997 |
| EP | 0 392 531 | 10/1990 |
| FR | 2630866 | 11/1989 |
| GB | 2 270 206 | 2/1994 |

* cited by examiner

*Primary Examiner*—Darren Schuberg
*Assistant Examiner*—Michael Datskovsky
(74) *Attorney, Agent, or Firm*—Penrose Lucas Albright

(57) ABSTRACT

An accommodation for electronic components contained in a circuit board. The accommodation comprises a housing which is rectangular as seen in plan and has a bottom wall and four side walls. The circuit board containing the electronic components is molded into the bottom wall and connectors project therefrom into the interior of the housing. An upright rim is defined around the top of the housing onto which is secured by screws a cover which, with the bottom wall and side walls, seal the interior of the accommodation against the entry of dirt and water. The bottom wall and the side walls are preferably composed of a synthetic material and elastic material is included in one of the longer side walls. An aperture through the elastic material is provided for sealingly receiving a cable for connection to the connectors extending from the circuit board and its electronic components. The sealing engagement of the cable with the elastic material is such as to prevent the entry of dirt or water into the interior of the accommodation. The cover of the accommodation is preferably composed of a metal and is operatively associated with equipment for cooling the interior of the accommodation including the circuit board and electronic components therein.

12 Claims, 2 Drawing Sheets

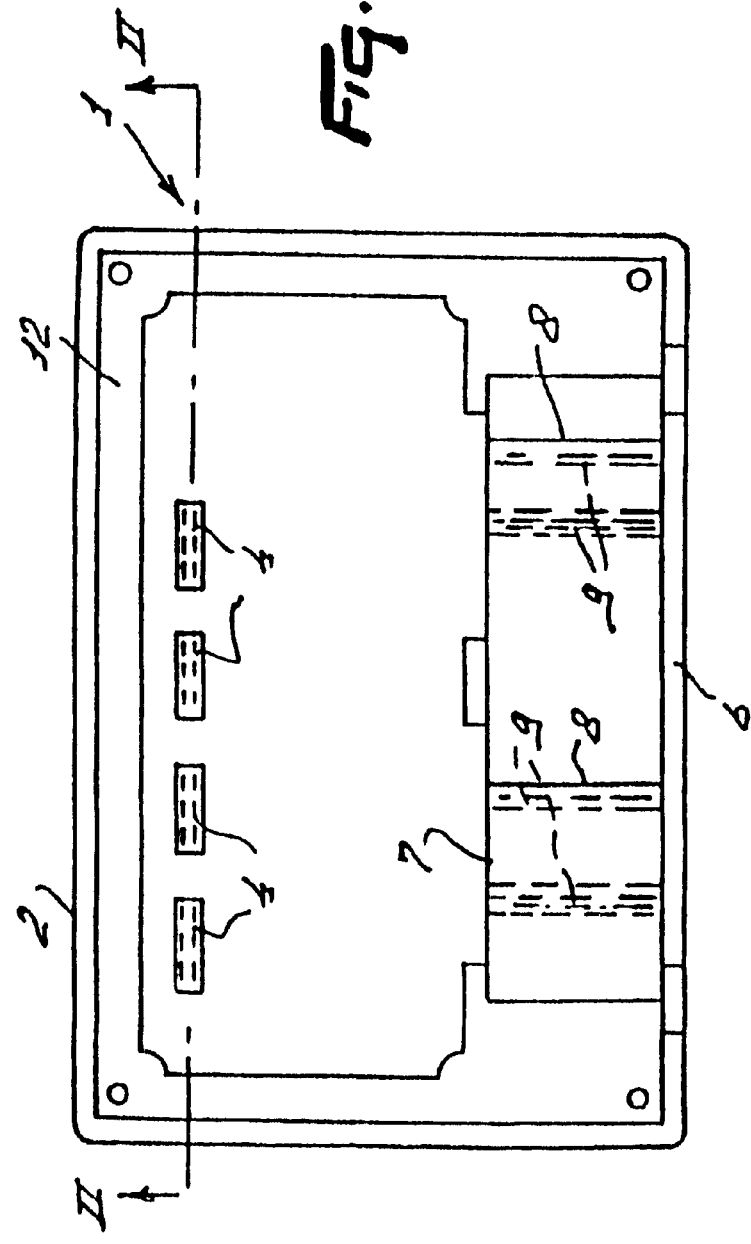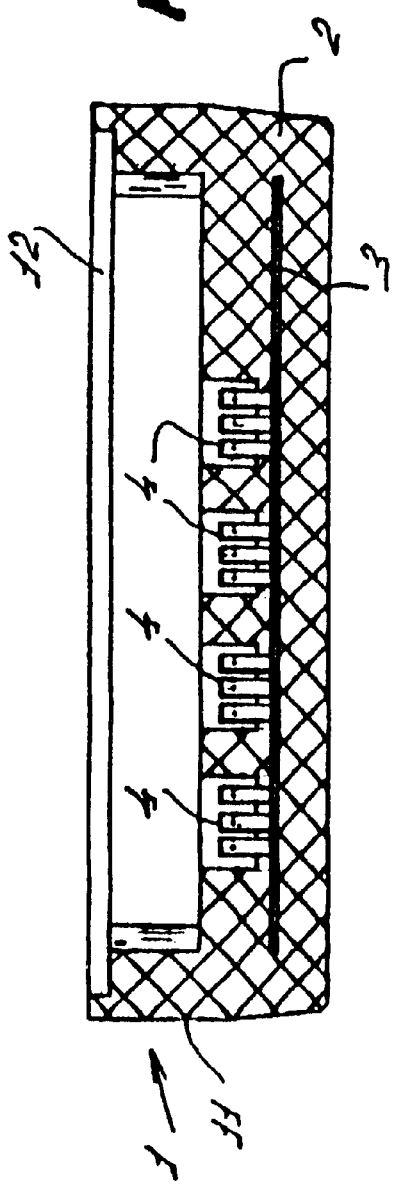

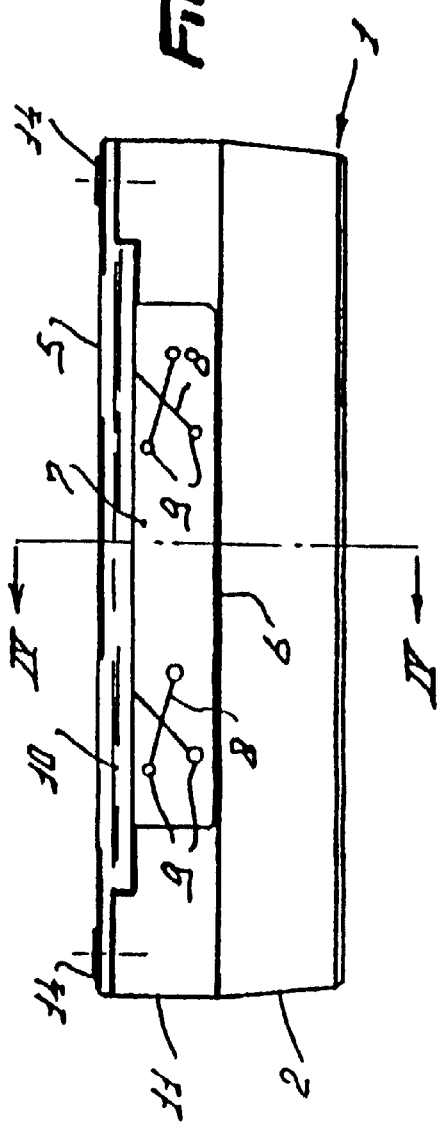
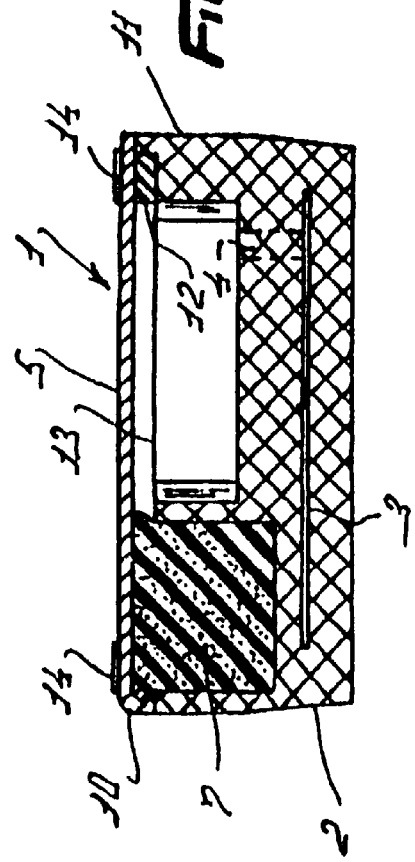

CLOSED BOX FOR ELECTRONIC EQUIPMENT

RELATED APPLICATION

This Application is a continuation of International Application No. PCT/NL00/00082, filed Feb. 10, 2000, which is, it is submitted, an appropriate amendment. A marked-up copy of the Specification of the invention is also submitted herewith for comparison purposes.

FIELD OF INVENTION

This invention relates to an electronic accommodation comprising a housing with at least one opening therein for receiving a cable therethrough, as well as a cover for sealing off the accommodation.

BACKGROUND OF THE INVENTION

With a prior art electronics accommodation the printed circuit board with electronics thereon is fastened to the bottom of the accommodation. Such accommodation has the disadvantage that, when it is disposed on a machine which it exposed to vibrations or shocks or both, the electronics will soon be out of order.

An object of the instant invention is to obviate the above-mentioned drawback or at least to minimize it.

SUMMARY OF THE INVENTION

In accordance with the invention, the foregoing object is achieved in that at least one wall of the housing includes a printed circuit board with electronics. Due to the fact that the electronics are included in the wall, it is impossible for the electronics to move relative to the accommodation and to get out of order as a result thereof.

According to an inventive feature, the connectors or the cooling conduits or both for the electronics project outwardly from the accommodation. According to again another inventive feature, the electronics are embedded in the wall of the accommodation by means of casting. According to yet another inventive feature, the casting means may be constituted by synthetic material. According to a further feature, the electronics are included in the bottom of the accommodation.

According to still another feature, in the recess in the accommodation there is disposed an elastic material in which there is provided at least one aperture for receiving a cable. The elastic material ensures the cable remains well enclosed, so that moisture and dirt are prevented from penetrating into the accommodation. For the purpose of obtaining additional sealing, the cover is provided with an elastic sealing edge. Said sealing edge is composed, for example, of rubber. According to again another inventive feature, the edge of the housing by which the cover is supported may also be provided with an upright rim. This upright rim may be formed during casting of the accommodation.

BRIEF DESCRIPTION OF THE DRAWINGS

The invention will now be explained in further detail with reference to the accompanying figures, in which:

FIG. 1 is a plan view of the electronics accommodation without a cover;

FIG. 2 is a cross-section of the electronics accommodation taken on arrows II—II in FIG. 1;

FIG. 3 is a side elevational view of the sealed electronics accommodation; and

FIG. 4 is a cross-section of the sealed electronics accommodation taken on arrows IV—IV in FIG. 3.

DETAILED DESCRIPTION OF THE PREFERRED EMBODIMENTS

FIG. 1 is a plan view of an electronics accommodation 1 comprising a housing 2 with electronics 3 fitted on a printed circuit board disposed therein. As shown in FIG. 2, electronics 3 are embedded in the bottom of housing 2. During casting of housing 2 electronics 3 are embedded in the bottom of housing 2, the connectors 4 remaining projected outwardly from housing 2. Non-shown cooling bodies for cooling electronics 3 also project outwardly from the bottom of housing 2. Housing 2 is preferably composed of synthetic material.

FIG. 3 is a side elevational view of electronics accommodation 1, in which housing 2 is sealed by a cover 5. In the side wall of housing 2 there is provided a recess 6 which is filled with elastic material 7. Elastic material 7 may be, by way of example, rubber. In elastic material 7 cuts 8 are provided in the upper side, said cuts 8 extending as far as bores 9 which are also provided in elastic material 7. Power cables, which are connected to connectors 4, may be entered into bores 9 via cuts 8. Because of the elasticity of the material, the cables are sufficiently enclosed so that dirt and water are prevented from penetrating into housing 2.

As shown in FIG. 4, elastic material 7 is retained by the curved edge 10 of cover 5 and by the upright rims 11 of the accommodation. Cover 5 is provided at its lower side with an elastic sealing edge 12 which is supported by a recess 13 of housing 2. Cover 5 may be detached by means of screws 14. Cover 5 is preferably composed of metal and the cooling bodies for the electronics 3 may be connected, if desired, to cover 5, so as to cool the electronics optimally.

Although I have disclosed the preferred embodiments of my invention, it is to be understood that it is capable of other adaptations and modifications within the scope of the following claims.

Having disclosed my invention, what I claim as new and to be secured by Letters Patent of the United States of America is:

1. An electronics accommodation which comprises a housing having a wall at its bottom, a printed circuit board being cast in said wall, said housing including side walls and a cover, at least part of one of said side walls being composed of an elastic material, the edge of said housing comprising an upright rim, a cover received in said upright rim which with said side walls and said bottom seals the interior of the accommodation against the entry of dirt and water, connectors to said circuit board and electronics projecting outwardly therefrom into the interior of the accommodation, at least one bore through said elastic material for receiving a cable therethrough and in sealing engagement therewith to prevent the entry of water and dirt into the interior of the accommodation through said bore.

2. An electronics accommodation in accordance with claim 1, wherein said side walls form a rectangle and said elastic material is disposed along a longer side of said side walls.

3. An electronics accommodation in accordance with claim 2, wherein said bottom wall and said side walls are composed of a synthetic material and said cover is composed of a metal.

4. An electronics accommodation in accordance with claim 3, wherein said cover is operatively associated with cooling means for cooling said printed circuit and said electronics.

5. An electronics accommodation comprising a housing, said housing having at least one recess therein for a cable therefor, a cover for sealing the accommodation, at least one wall of the housing which includes a printed circuit board with electronics, and connectors for said electronics on said circuit board which project outwardly from said one wall.

6. An electronics accommodation comprising a housing, said housing having at least one recess therein for a cable therefor, a cover for sealing the accommodation, at least one wall of the housing which includes a printed circuit board with electronics, said cover being composed of metal and operatively associated with cooling means for cooling said printed circuit board with said electronics.

7. An electronics accommodation comprising a housing, said housing having at least one recess therein for a cable therefor, a cover for sealing the accommodation, and at least one wall which includes a printed circuit board with electronics, said printed circuit board with electronics being embedded in said one wall by being cast therein.

8. An electronics accommodation in accordance with claim 7 wherein said one wall is composed of a synthetic material.

9. An electronics accommodation in accordance with claim 8 wherein said one wall comprises the bottom of the accommodation.

10. An electronics accommodation comprising a housing, said housing having at least one recess therein for a cable therefor, a cover for sealing the accommodation, at least one wall of the housing which includes a printed circuit board with electronics, a recess, and elastic material disposed in said recess, said elastic material comprising at least one aperture which is suitable for receiving said cable therethrough and in a sealing engagement.

11. An electronics accommodation comprising a housing, said housing having at least one recess therein for a cable therefor, a cover for sealing the accommodation, at least one wall of the housing which includes a printed circuit board with electronics, and an elastic sealing edge which is disposed between said cover and said one wall for preventing dirt and water from entering the accommodation.

12. An electronics accommodation comprising a housing, said housing having at least one recess therein for a cable therefor, a cover for sealing the accommodation, at least one wall of the housing which includes a printed circuit board with electronics, and an upright rim disposed around the edge of said housing, said upright rim supporting said cover.

* * * * *